United States Patent
Poland (12)

(10) Patent No.: US 7,489,136 B1
(45) Date of Patent: Feb. 10, 2009

(54) APPARATUS AND METHOD OF DETECTING RADIATION

(75) Inventor: William F. Poland, Highland, CA (US)

(73) Assignee: Nu-Trek, Inc., San Diego, CA (US)

( * ) Notice: Subject to any disclaimer, the term of this patent is extended or adjusted under 35 U.S.C. 154(b) by 8 days.

(21) Appl. No.: 11/499,842

(22) Filed: Aug. 4, 2006

Related U.S. Application Data

(60) Provisional application No. 60/705,354, filed on Aug. 4, 2005.

(51) Int. Cl.
  *G01R 31/08* (2006.01)
  *G08B 29/00* (2006.01)
  *G08B 17/12* (2006.01)
(52) U.S. Cl. .................. 324/522; 340/514; 340/578
(58) Field of Classification Search .............. 324/522, 324/96, 95, 750, 501, 702, 158.1; 250/250, 250/252.1, 370.09; 340/600, 693.6; 376/245, 376/254, 255, 259
See application file for complete search history.

(56) References Cited

U.S. PATENT DOCUMENTS

| | | | | |
|---|---|---|---|---|
| 3,657,713 A * | 4/1972 | Sasaki et al. | ............. | 340/514 |
| 3,882,477 A * | 5/1975 | Mueller | ............. | 340/510 |
| 4,184,768 A * | 1/1980 | Murphy et al. | ............. | 356/326 |
| 4,451,785 A * | 5/1984 | Rozniecki et al. | ............. | 324/766 |
| 4,544,843 A * | 10/1985 | Kern et al. | ............. | 250/239 |
| 4,687,622 A * | 8/1987 | Longden | ............. | 376/254 |
| 4,975,683 A * | 12/1990 | Parsons et al. | ............. | 340/578 |
| 5,276,400 A * | 1/1994 | Denyer et al. | ............. | 324/750 |
| 5,672,918 A | 9/1997 | Kimbrough et al. | | |
| 5,811,809 A | 9/1998 | Smith et al. | | |
| 6,064,555 A | 5/2000 | Czajkowski et al. | | |
| 6,388,250 B1 * | 5/2002 | Croydon et al. | ............. | 250/252.1 |
| 7,183,555 B2 * | 2/2007 | Jarron | ............. | 250/370.01 |
| 2002/0079439 A1 * | 6/2002 | Croydon et al. | ............. | 250/252.1 |
| 2004/0058503 A1 * | 3/2004 | Cha | ............. | 438/326 |
| 2007/0176200 A1 * | 8/2007 | Hatanaka et al. | ............. | 257/184 |

FOREIGN PATENT DOCUMENTS

DE   102004057741 A1 *   6/2006

OTHER PUBLICATIONS

Hash et al. Radiation Characterization of a Monolithic Nuclear Event Detector, IEEE, Aug. 1992, pp. 82-86, Issue No. 0-7803-0930-8/92.
AET, Inc. SBIR Award May 14, 2004, "Development of Nuclear Event Detection and Circumvention Controller Technology," 1 page.

(Continued)

*Primary Examiner*—Vincent Q Nguyen
*Assistant Examiner*—Hoai-An D Nguyen
(74) *Attorney, Agent, or Firm*—Knobbe Martens Olson & Bear LLP

(57) ABSTRACT

Embodiments include apparatus and method of detecting radiation. One embodiment comprises device for detecting radiation. The device comprises a sensor configured to generate an electrical signal in response to radiation and a test circuit configured to provide an electrical signal to the sensor. Certain embodiments are configured as nuclear event detectors that are configured to detect radiation from a nuclear event.

33 Claims, 7 Drawing Sheets

OTHER PUBLICATIONS

Maxwell Technologies. HSN-3000 Nuclear Event Detector, www.maxwell.com, Jan. 7, 2005.

MBDA UK. Limited Nuclear Event Detector (NED), www.microcircuit.com, Mar. 2006.

"Development of Nuclear Event Detection and Circumvention Controller Technology," Topic N04-152, Navy FY04_1 SBIR Solicitation, 166 pages (see e.g., p. 165), earlier than Jan. 15, 2004.

* cited by examiner

APPARATUS AND METHOD OF DETECTING RADIATION

RELATED APPLICATIONS

This application claims the benefit of, and incorporates by reference in its entirety, U.S. Provisional Application No. 60/705,354, filed on Aug. 4, 2005.

STATEMENT REGARDING FEDERALLY SPONSORED R&D

This invention was made at least in part under a contract with an agency of the United States Government under Contract No. HQ0006-04-C-7039 awarded by the Missile Defense Agency (MDA), Contract No. HQ0006-04-C-7020 awarded by the MDA, and Contract No. N00178-04-C-1037 awarded by the Department of the Navy.

BACKGROUND OF THE INVENTION

1. Field of the Invention

This application relates to apparatuses and methods of detecting radiation.

2. Description of the Related Technology

Radiation detectors generally include a sensor that generates an electrical output in response to radiation and a detector that determines the presence of radiation based on the signal generated by the sensor. Such detectors may output a signal that is indicative of the presence of such radiation. Radiation detectors may, for example, be responsive to electromagnetic radiation such as visible or non-visible light, ionizing radiation (including ionizing electromagnetic radiation and ionizing particle radiation), or other charged or uncharged particles such as neutrons. Applications of radiation detectors include light or other electromagnetic radiation detectors and ionizing radiation detectors. A need exists for reliable, and/or compact radiation detectors.

SUMMARY OF THE INVENTION

The system, method, and devices of the invention each have several aspects, no single one of which is solely responsible for its desirable attributes. Without limiting the scope of this invention as expressed by the claims which follow, its more prominent features will now be discussed briefly. After considering this discussion, and particularly after reading the section entitled "Detailed Description of Certain Embodiments" one will understand how the features of this invention provide advantages that include increased reliability and reduced size.

One embodiment comprises a device for detecting radiation. The device comprises a sensor configured to sense radiation. The device further comprises a test circuit configured to provide an electrical signal to the sensor for testing the sensor.

Another embodiment comprises a method of making a device for detecting radiation. The method comprises forming a sensor configured to sense radiation. The method further comprises electrically connecting a detector to the sensor. The method further comprises electrically connecting a test circuit to the sensor.

Another embodiment comprises a device for detecting radiation. The device comprises means for sensing radiation. The device further comprises means for outputting a signal based on an electrical signal received from the means for sensing radiation. The device further comprises means for providing an electrical test signal to the means for sensing.

DETAILED DESCRIPTION OF CERTAIN EMBODIMENTS

The following detailed description is directed to certain specific embodiments of the invention. However, the invention can be embodied in a multitude of different ways as defined and covered by the claims. In this description, reference is made to the drawings wherein like parts are designated with like numerals throughout.

Generally, discrete p-type, intrinsic, n-type diode (PIN) diodes may be used as radiation sensing elements in a radiation detector. As discussed further herein, in one embodiment, the radiation sensing elements comprise transistors that are fabricated using the same process used to fabricate the detector and test elements of the device. Advantageously, such embodiments may be monolithically fabricated on a substrate that is diced to from a single integrated circuit (IC) comprising the radiation detector. In one embodiment, a nuclear event detector is fabricated on a monolithic integrated circuit using a BiCom (bipolar complementary metal oxide semiconductor) process.

Figure 1:
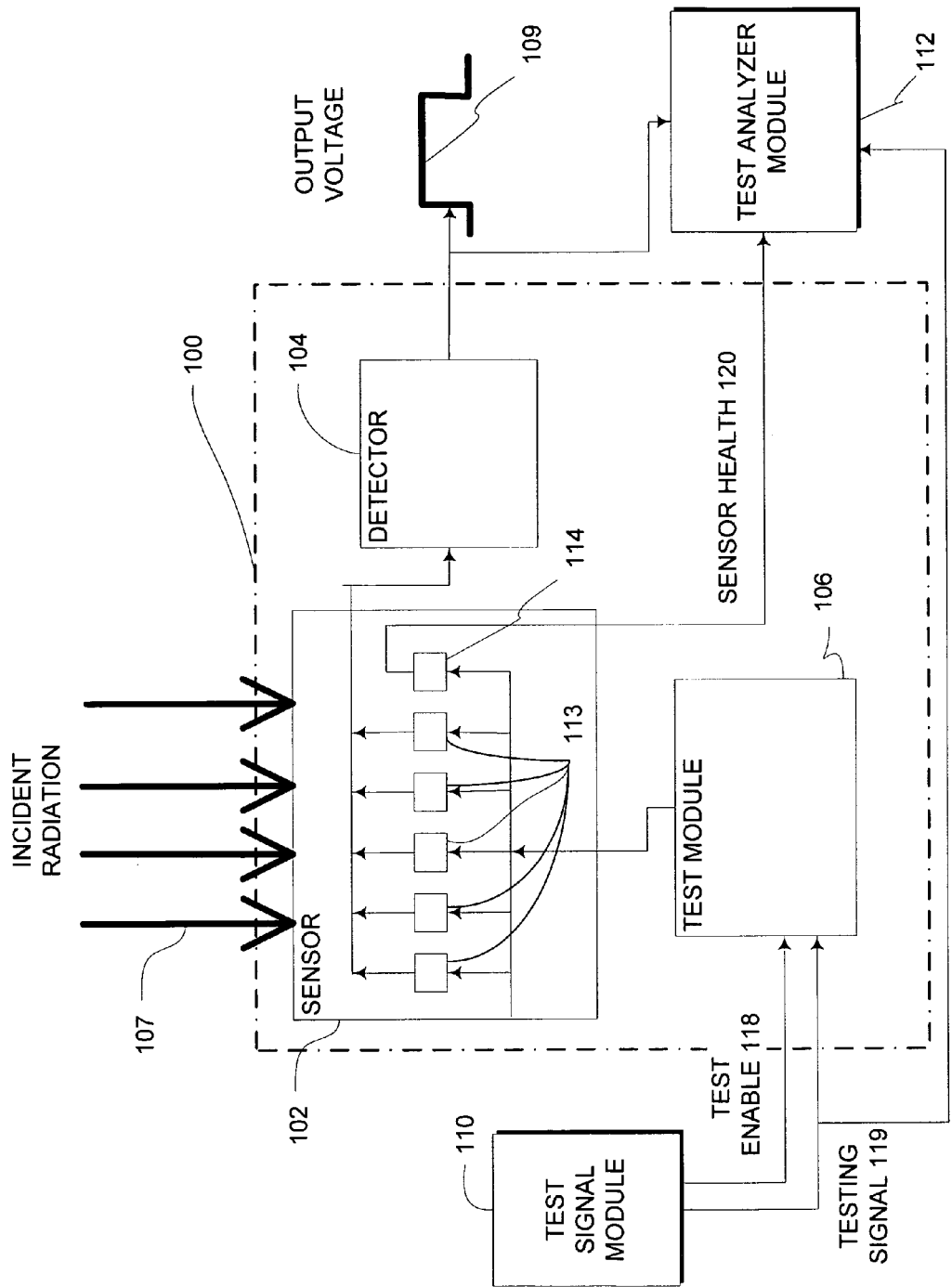
FIG. 1 is a functional block diagram of one embodiment comprising a radiation detector.

FIG. 1 is a functional block diagram of one embodiment comprising a radiation detector 100 that is configured to be activated, or triggered, by radiation. In one embodiment, the radiation detector 100 is used for detection of a nuclear event. For example, the radiation detector 100 may be configured to detect ionizing radiation such as prompt gamma rays such as produced in a nuclear event. The radiation detector 100 may be configured to provide a step function output or other signal suitable for circumvention and recovery schemes in an electronic system or other apparatus that may be initiated following a nuclear explosion. In one embodiment, the radiation detector 100 comprises a sensor module 102 configured to produce a current in response to radiation and provide that current to a detector module 104. The detector module 104 is configured to detect the presence of radiation based on the current produced by the sensor module 102. The radiation detector 100 may also comprise a test module 106 configured to test the sensor module 102 and/or the detector module 104. The test module 106 provides electrical signals to the sensor and/or the detector module 104. The electrical signals test the response of the sensor 102 and the detector module 104. The test module 106 may be further connected to a test signal module 110 that generates the electrical testing signals. A test analyzer module 112 may also, for example, be connected to the test signal module 110, the sensor module 102, and/or the detector module 104. The test analyzer module 112 compares signals output by the sensor module 102 and detector module 104 in response to the testing signal and identifies faults, e.g., to a user or another system component. In one embodiment (now shown), one or more functions of the test signal module 110 and/or the test analyzer module 112 may be performed in the radiation detector 100, e.g., by the test module 106.

The radiation detector 100 may thus be configured to operate in at least two modes comprising a) a detecting mode in which the sensor module 102 is configured to respond to radiation incident upon the sensor module 102 and b) a test mode in which the sensor module 102 and detector module 104 is configured to respond to the testing signals provided by the test module 106 with the response being analyzed by the test analyzer module 112.

In one embodiment, incident radiation 107 induces a current in the sensor module 102. The sensor module 102 may be configured to respond to various forms of incident radiation 107, such as electromagnetic radiation (including visible and non-visible, light), ionizing radiation (including ionizing electromagnetic radiation and ionizing particle radiation), gamma rays, or other charged or uncharged particles such as ions or neutrons. In one embodiment, the sensor module 102 is configured to respond to prompt gamma radiation. Prompt gamma radiation generally refers to gamma-ray pulses with a pulse width of less than about 100 ns that are generated during a nuclear event. It is to be recognized that while one embodiment has been disclosed for use in a nuclear event detector, other embodiments may, for example, use other types of sensors such as heat, pressure, humidity, or salinity sensors.

The sensor module 102 may comprise one or more sensor elements or circuits that generate a charge or current in response to the incident radiation 107. As shown in FIG. 1, the sensor circuits may comprise one or more radiation sense transistors 113 having their emitters and collectors connected in parallel. FIG. 1 illustrates five (5) sense transistors 113. Other embodiments may comprise other numbers of sense transistors 113, e.g., ten (10) transistors. The radiation sense transistors 113 may comprise transistors formed by a BiCom process. FIG. 1 also illustrates that the output of the collectors of the transistors 113 may be combined and provided to the detector module 104 as the output signal of the sensor 102. In operation, the sensor elements, e.g., the sensor transistors 113, generate a current in response to receiving incident radiation.

The sensor 102 may further comprise a testing transistor 114 that is configured to be substantially identical to the transistors 113 with the exception that the collector of the testing transistor 114 is connected to the test analyzer module 112. The testing transistor 114 thereby provides a sensor health signal 120 to the test analyzer module 112. Use of the testing transistor 114 is discussed in more detail below with reference to the test module 106. In one embodiment, the sensor 102 may comprise groups or blocks of sensor circuits 113 that provide redundancy to the sensor 102. In one embodiment, each of the sensor blocks may comprise at least one testing transistor 114 to allow testing of each of the sensor blocks.

In one embodiment, the semiconductor sensor devices are desirably formed using materials and a manufacturing process that is compatible with the process used to make the detector module 104 and the test module 106. For example, each of the sensor module 102, the detector module 104, and the test module 106 may be manufactured using a commercially available process such as BiCOM1.5. In one embodiment, two or more of the sensor module 102, the detector module 104, and the test module 106 may thus be formed in a single, monolithic, integrated circuit. In one such embodiment, the sensor module 102, the detector module 104, and the test module 106 form a monolithic integrated circuit. Embodiments that include monolithic integrated circuits advantageously have fewer parts to integrate and produce a more compact apparatus. Embodiments of the radiation detector 100 may comprise a material such as one or more of Si, Ge, GaAs, SiGe, GaN, InGaAs, InSb, HgCdTe, $B_2Te_3$, A—Si, A—Se, $HgI_2$, $PbI_2$, C—SiGe, C (diamond), $YBa_2Cu_3O_{7-y}$, Bi—Sr—Ca—Cu—O compounds, and SiC.

In one embodiment, the detector module 104 is configured to detect the presence of radiation based on a current provided by the sensor module 102 and output a signal indicative of the presence of the incident radiation 107. For example, the detector module 104 may compare a current generated by the sensor module 102 to a threshold current, Itd, and output a signal pulse 109 when the sensor current exceeds the threshold current. In one embodiment, The signal pulse 109 may comprise a step function of one voltage, e.g., logic high, after detecting the incident radiation 107 and to output another voltage, e.g., logic low otherwise. In some applications, the incident radiation 107 may have a range of different pulse shapes. In one embodiment, the detector module 104 may be advantageously configured to output a signal substantially independent of the pulse shape of the incident radiation 107.

The test module 106 is connected to either or both of the sensor 102 and the detector module 104. The test module 106 may be configured to test either or both of the sensor module 102 and the detector module 104 to determine whether each is working properly. The test module 106 may be initiated by one or more of: automatically by a system that uses the radiation detector 100, by an operator, or by test equipment. In one embodiment, the test signal module 110, under control of an operator, other system components, or test equipment may generate a test enable signal 118 and the testing signals 119. Thus, in one embodiment, the test signal module 110 may comprise a signal generator that may be controlled manually by an operator, or electrically by another component such as a computer or a user terminal. The test enable signal 118 may comprise a logic high (or logic low) signal that directs the test module 106 to turn on testing mode. The testing signals 119 may comprise one or more of a test current, a test voltage, or a test command for controlling the test module 106. The test signal module 110 may also provide the testing signal 119 to the test analyzer module 112 for comparison to the outputs of the sensor 102 and detector module 104. The test module 106 may be configured to provide full end-end self test of the sensor module 102 and the detection module 104.

The test module 106 may perform a built in test (BIT). As radiation detectors 100 without built in test functions are generally removed from systems for periodic calibrations, an in-situ calibration using a built in test can result in very significant cost savings over the lifetime of the detector 100. The test module 106 may be configured to verify operation of the sensor module 102 and to verify operation and calibration of the detector module 104. The test module 106 may also be configured to determine whether some or all sensing elements of the sensor module 102 are operational. For example, the test module 106 may be configured to test the sensor 102 and/or the detector module 104 in at least three different ways that include one or more of a sensor/detector test, sensor integrity test, and a response time test.

The sensor/detector test is directed to testing the combined operation of the sensor 102 and the detector module 104. During the sensor/detector test, the test module 106 provides at least two different current levels relative to the threshold current, Itd, of the detector module 104. The first testing signal 119 comprises a current that is less than the threshold current, e.g., at a current level that is 80% of the threshold current. When the test module 106 provides the first current to the sensor 102, the detector module 104 does not respond with the voltage pulse 209 when it is operating correctly. Accordingly, the test analyzer module 112 determines that a fault is present in the sensor 102 or the detector module 104 if the detector module 104 outputs a voltage pulse in response to the first current.

The second sensor/detector testing signal 119 comprises a second current that is greater than the threshold current, e.g., a current level that is 120% of the threshold current. When the test module 106 provides the second current to the sensor 102, the detector module 104 responds with the voltage pulse when it is operating correctly. Accordingly, the test analyzer module 112 determines that a fault is present in the sensor 102 or the detector module 104 if the detector module 104 fails to output the voltage pulse 109 in response to the second current. In one embodiment, the test signal module 110 generates the second 120% current signal by generating the first 80% current and combining it with another signal at a current level that is 40% of the threshold current.

The sensor integrity test is directed to determining whether one or more of the sensing circuits, e.g., the sense transistors 113, of the sensor 102 is defective. During the sensor integrity test, the test signal module 110 provides the testing signal 119 at a current level, Itest. The test analysis module 112 receives the sensor health signal 120 from the testing transistor 114 and compares the current level of the sensor health signal 120 to a current, Itest. If the sensor 102 comprises N sense circuits, then when all N sense circuits are operating properly, the current level of the sensor health signal 120 is about $(1/(N+1))*Itest$. If one or more of the sensing circuits is defective, the current level of the sensor health signal 120 is greater or less than $(1/(N+1))*Itest$. Thus, the test analysis module 112 may determine that a fault is present in the sensor 102 if the sensor health signal 120 has a current level that is not about $(1/(N+1))*Itest$. In one embodiment, the current Itest may be one of the two currents provided in the sensor/detector test to allow the sensor/detector test to be conducted in parallel with the sensor integrity test.

The response time test is directed to testing the ability of the sensor 102 and detector module 104 to generate a signal within a particular or desirable response time of receiving the testing signal 119. For example, in one application, a response time of less than about 50 ns may be desirable. Accordingly, in the response time test, the test signal module 110 provides the testing signal 119 with a current level that is sufficient to activate a properly operating sensor 102/detector module 104 combination within a particular or desired response time. For example, in one embodiment, the current level of the response time testing signal 119 is 300% of the threshold current, Itd. When the test module 106 provides the current to the sensor 102, the detector module 104 responds with the voltage pulse 209 within about 50 ns when it is operating correctly. Accordingly, the test analyzer module 112 determines that a fault is present in the sensor 102 or the detector module 104 if the detector module 104 fails to output the voltage pulse 109 within about 50 ns. This test may be repeated for various current levels to map out or characterize the current response characteristic of the sensor 102 and the detector module 104 over a range of current values.

Figure 2:
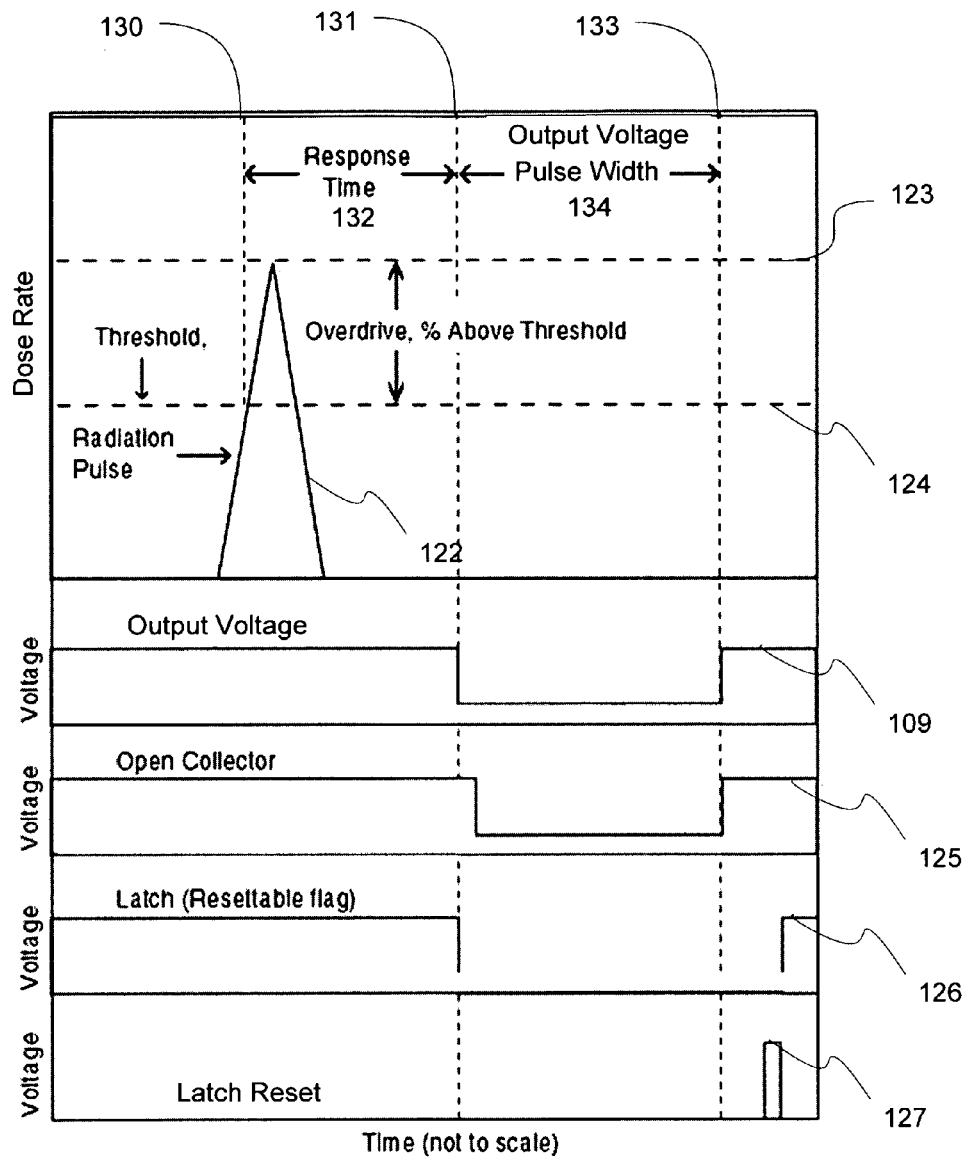
FIG. 2 is a timing diagram illustrating relationships between input and output signals to a radiation detector such as illustrated in FIG. 1.

FIG. 2 is a timing diagram illustrating relationships between input and output signals to an embodiment of the radiation detector 100 when configured to detect radiation. The horizontal axis represents time. The vertical axis represents a voltage level. A trace 122 represents sensor signal induced in the sensor module 102 by the incident radiation 107. The trace 122 illustrates a short radiation pulse peak, with a peak dose rate (e.g., incident radiation per time) indicated by a dashed trace 123. In one embodiment, the detector module 104 is configured to generate an output signal when the sensor signal 122 exceeds a threshold voltage that is indicated by a trace 124. As illustrated in FIG. 2, the sensor signal 122 exceeds the threshold 124 at a time denoted by a trace 130. In response, the detector module 104 generates an output voltage, illustrated by a trace 109. Embodiments of the radiation sensor may also output a number of other interface signals in response to detecting radiation that are advantageous in applications such as nuclear event detectors. For example, the detector module 104 may also output an open collector voltage, illustrated by a trace 125, and a latch voltage, indicated by a trace 126, in response to the detected radiation 122. In addition, the detector module 104 may also receive interface signals from other system components (not shown) such as a latch reset signal illustrated by a trace 127 to control the latch voltage 126.

As illustrated in FIG. 2, the output voltage 109 may comprise a signal such as a voltage step-function pulse. A trace 109 illustrates such a step function as a change from a first voltage to a second voltage beginning at a time indicated by a dashed trace 131. At a time indicated by a trace 133, the output voltage returns to the first voltage. In one embodiment, the output voltage 109 defines a step function between the first and second voltages. In one embodiment, the first voltage is a logic "high" voltage of between about 3 and 5 volts and the second voltage is a logic low voltage of less than 0.5 volts. The time period between the time denoted by trace 130 and the time denoted by trace 131 represents the response time 132 of the radiation detector 100. In one embodiment, the response time 132 is less than about 15 ns. The time period between the time denoted by trace 131 and the time denoted by trace 133 represents the pulse width 134 of the output voltage 109. In one embodiment, the pulse width is between about 1 and 2 μs.

The detector module 104 may be configured to extend the pulse width of the output voltage 109 when two or more incident radiation pulses are close in time. For example, if the sensor module 102 detects a second incident radiation 107 event that is 200 ns or more after the first but within the pulse width of the output voltage, the detector module 104 may be configured to continue the pulse of the output voltage 109 for another 1-2 μs after the second event. In contrast, if a second event occurs in less than about 200 ns after the first event, the detector module 104 may be configured not to increase pulse width of the output voltage 109. In applications related to nuclear event detection, the output voltage signal 109 provides sufficient indication, e.g., to provide nuclear event circumvention, without increasing the pulse width of the output voltage 109 for events that the detector module 104 receives within less than about 200 ns of each other.

In one embodiment, the detector module 104 may also output additional interface signals such as the open collector voltage 125 in response to the incident radiation 107. The open collector voltage 125 approximately matches the voltage of the output voltage signal 109. The open collector voltage 125 may be connected to the open collector voltages 125 of a group of radiation detectors 100 to form an "OR" circuit so that if any is activated, the output signal of the group is the output voltage 125 of the activated radiation detector 100.

In one embodiment, the detector module 104 also outputs the latch voltage 126. The radiation detector 100 may switch the latch voltage 126 from a first voltage (e.g., logic high) to a second voltage (e.g., logic low) at the time 131. The detector module 104 may be configured to receive a latch reset signal from another system component to control the latch voltage 126. Unlike the output voltage 109, the radiation detector 100 maintains the latch voltage 126 at the second voltage until the radiation detector 100 receives a pulse in the latch reset signal. A trace 127 illustrates a latch reset signal and pulse according to one embodiment. After receiving the latch reset pulse, the detector module 104 resets the latch voltage 125 back to the first voltage.

Figure 3:
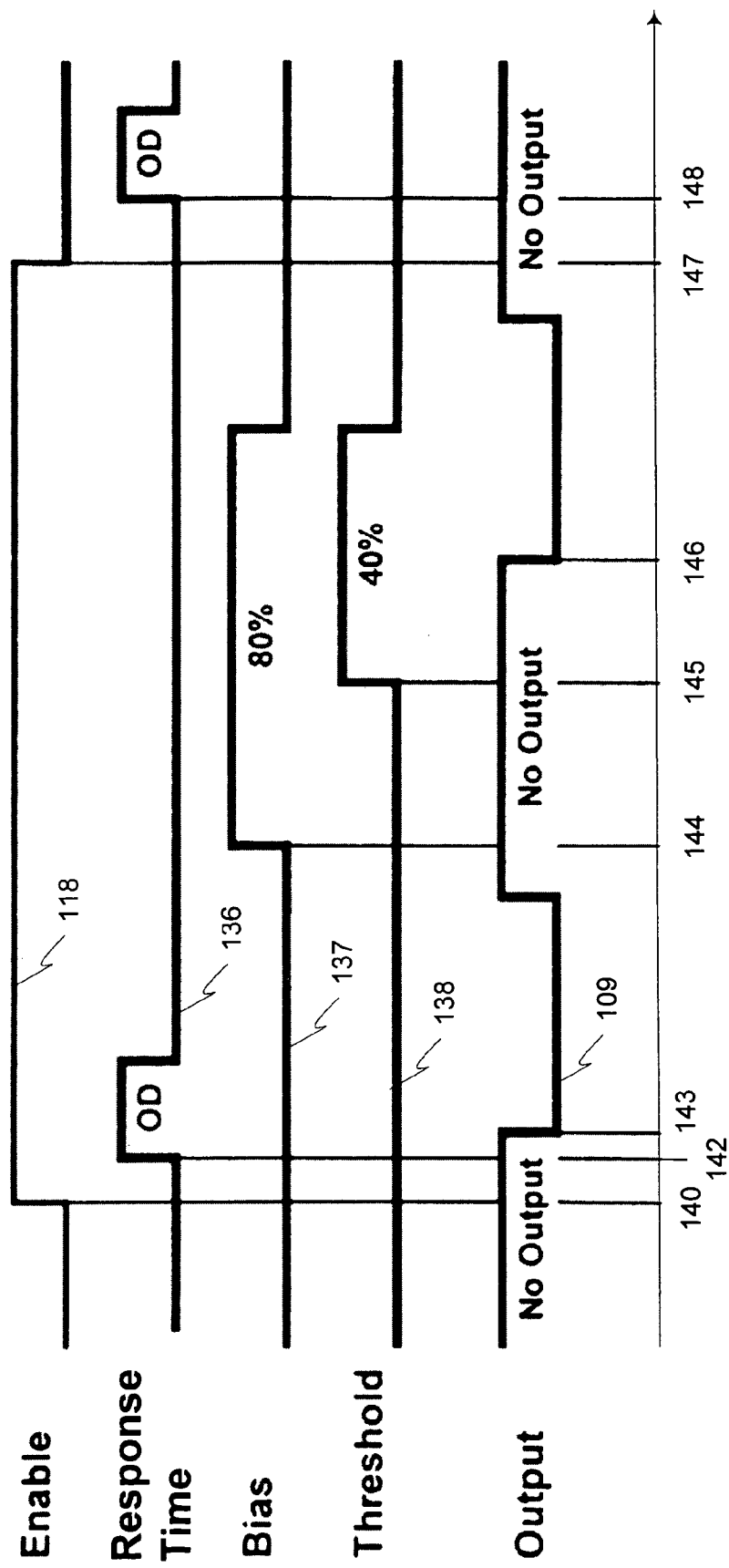
FIG. 3 is a timing diagram illustrating relationships between currents provided for testing a radiation detector such as illustrated in FIG. 1.

FIG. 3 is a timing diagram illustrating exemplary relationships between the test enable signal 118, the testing signals 119 of the sensor/detector test and the response time test described above with reference to the test module 106 of FIG. 1, and the output voltage 109 of the detector module 104. A trace 118 illustrates the corresponding test enable signal 118 provided to the test module 106. A trace 136 illustrates the testing signal described with reference to the response time test. A trace 137 illustrates the sensor/detector testing signal 119 that has a current level less than the threshold current of the detector module 104. A trace 138 illustrates the sensor/detector testing signal 119 that has a current level that when combined with the current illustrated in trace 137 exceeds the threshold current of the detector module 104. The output signal 109 of the detector module 104 is illustrated by a corresponding trace 109.

At a time 140, the test signal module 110 begins providing a test enable signal 118 in a logic high state to the test module 106. Next, at a time 142, as illustrated by the trace 136, the test signal module 110 provides the response time test signal as a pulse of current that is configured to generate a response from the detector module 104 within a predetermined time period, e.g., in less than 50 ns. The trace 136 illustrates a testing signal 119 having a current level that is 300% of the threshold current. Moving to time 143 (approximately 50 ns later), the detector module 104 provides a logic low output voltage pulse as illustrated by the trace 109.

At time 144, the test signal module 110 provides the sensor/detector testing signal 119 that has a first current that is 80% of the threshold current, as illustrated by the trace 137. As illustrated by trace 109, the detector module 104 does not signal detection from first current when the sensor 102 and the detector module 104 are operating properly. Next at a time 145, as illustrated in the trace 138, the test signal module 110 provides the sensor/detector testing signal 119 that has a second current that is 40% of the threshold current of the threshold current. As illustrated in the trace 137, if the test signal module 110 continues to provide the first current while providing the second, the total current is 120% of the threshold current of the detector module 104. Thus, as illustrated by the trace 109, at a time 146, the detector module 104 provides a logic low pulse in the output signal 109 to indicate that the sensor 102 and the detector module 104 are operating properly. At a time 147, as illustrated in the trace 118, the enable signal stops. Thus, at time 148, even though the test signal module 110 provides another pulse along trace 136, the output trace 109 shows no response because the enable signal 118 is low, or off.

Figure 4:
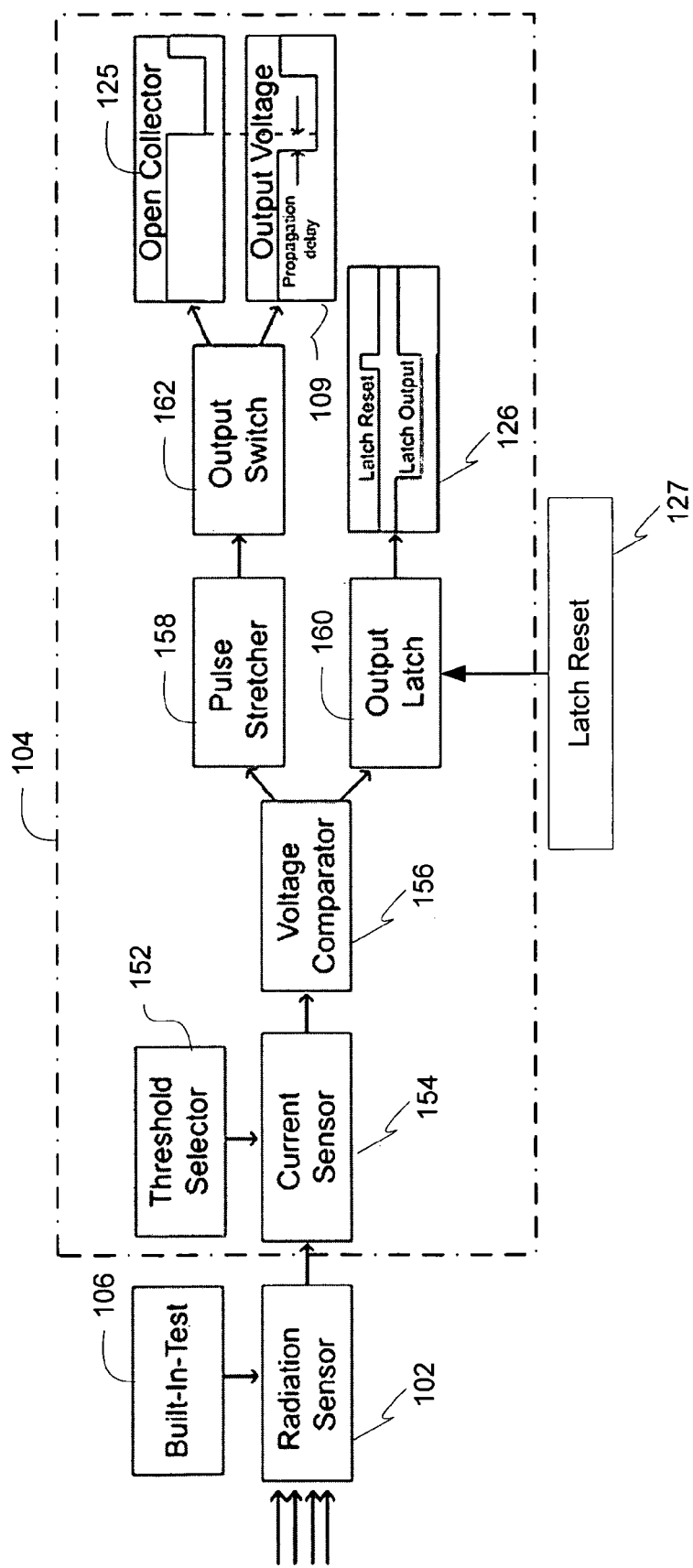
FIG. 4 is a functional block diagram illustrating in more detail one embodiment of a radiation detector such as illustrated in FIG. 1.

FIG. 4 is a functional block diagram illustrating in more detail one embodiment of the detector module 104 of FIG. 1.

In the illustrated embodiment, the detector module 104 comprises a threshold selector 152 configured to provide a threshold current to a current sensor 154. The current sensor 154 is configured to provide an output signal to a voltage comparator 156 that in turn provides an output signal to a pulse stretcher 158 and an output latch 160. The pulse stretcher 158 controls the output signal of an output switch 162.

In one embodiment, the radiation sensor 102 is configured to generate a current, e.g., a photocurrent in response to incident radiation 107. For example, to detect prompt gamma rays, the radiation sensor 102 may comprise ten BiCom transistors that have a surface area of about 2048 $\mu m^2$. The threshold selector 152 provides a threshold definition current, Itd, that is substantially equal to the current output by the radiation sensor 102 if a desired threshold radiation level is received. The threshold selector 152 may comprise an external selectable resistor (not shown) that adjusts the threshold definition current depending on a selected threshold dose rate. The current sensor 154 receives the threshold definition current from the threshold selector 152 and the output by the radiation sensor 102. When the current of the radiation sensor 102 exceeds the threshold definition current, the current sensor 152 outputs a low voltage, e.g., about 0.5 volts, otherwise the current sensor 154 outputs a logic high voltage of about 3-5 volts. Note that embodiments may use other voltage schemes such as the reverse of the described mode of operation and other voltage levels such as 8 and 10 volts.

The voltage comparator 156 receives an output signal from the current sensor 154. When the voltage comparator 156 detects that this output signal comprises a low or zero voltage, the voltage comparator 156 activates the pulse stretcher 158, the output latch module 160, and the output switch 162. The pulse stretcher 158 determines the pulse width of the output voltage signal 109 and the open collector signal 125 of FIG. 2. The pulse stretcher 158 may comprise a capacitor that charges to extend the output for about 2 Us. The output switch 162 generates the output voltage 109 and the open collector voltage 125 as described above with reference to traces 109 and 125 of FIG. 2. The output latch module 160 generates the output latch signal 126 based at least partly on the latch reset signal 127 as described with reference to FIG. 2 and the traces 126 and 127.

Figure 5:
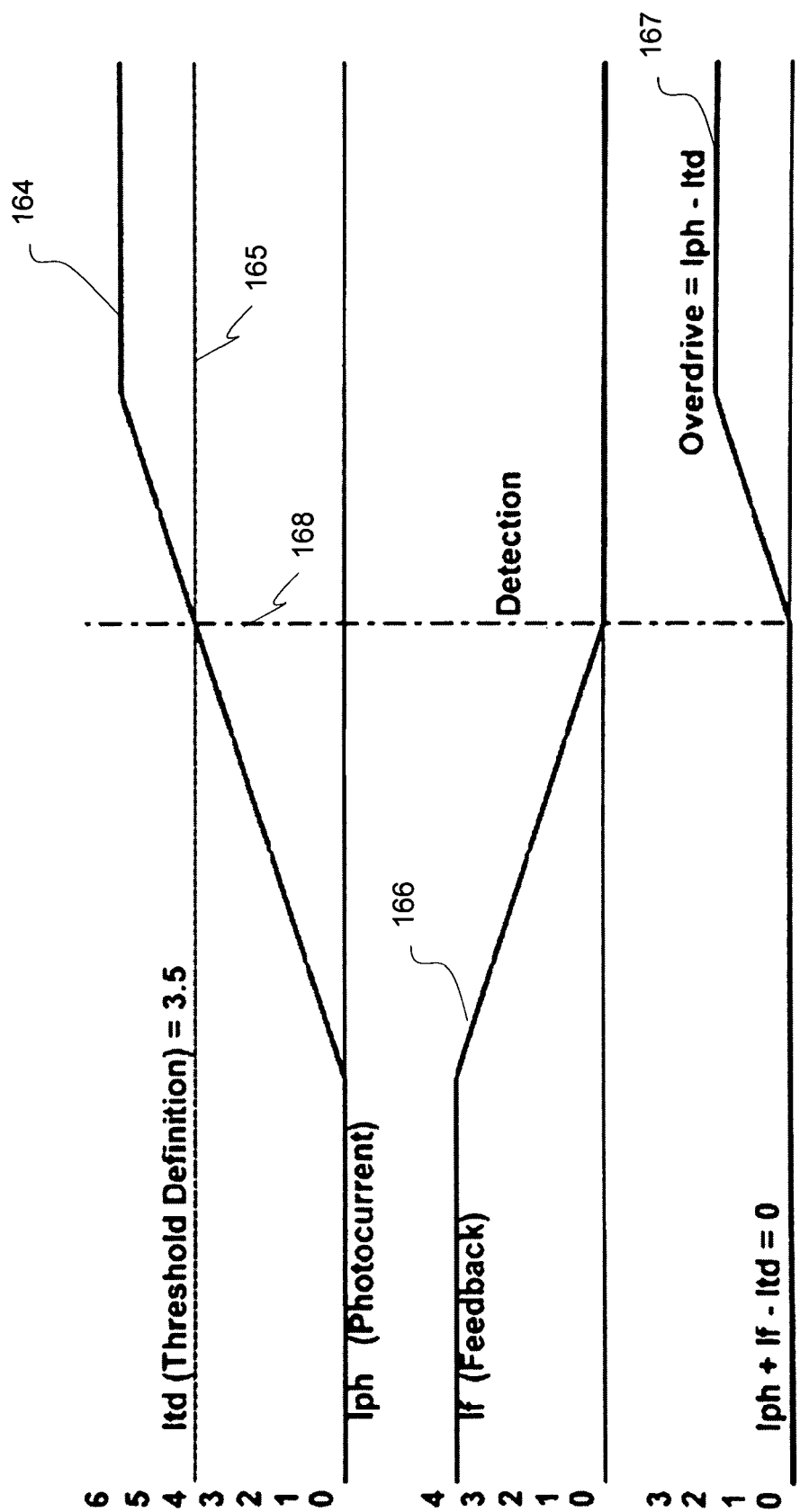
FIG. 5 is a timing diagram illustrating relationships between sensing currents and detector currents in a radiation detector such as illustrated in FIG. 4.

FIG. 5 is a timing diagram illustrating exemplary relationships between sensing currents and detector currents in the radiation detector 100. The vertical axis represents current and the horizontal axis represents time. A trace 164 illustrates the photocurrent, Iph, generated by the radiation sensor 102 as radiation increases over time. A trace 165, which has a substantially constant value, illustrates the threshold definition current, Itd, generated by the threshold selector 152. A trace 166 represents the feedback current, If, generated within the current sensor 154 representing the difference between the threshold definition current of trace 165 and the photocurrent of trace 164. A trace 167 represents an overdrive current, Io, output by the current sensor 154 to the voltage comparator 156. The overdrive current 167 represents the difference between the photocurrent Iph and the definition current Itd (e.g., Iph–Itd).

The trace 164 illustrates that as incident radiation is received, the photocurrent Iph increases from 0 and surpasses the threshold current Itd at a time indicated by a vertical line 168. The trace 166 illustrates a corresponding reduction in the feedback current from the threshold current value to zero at the time 168. The trace 167 illustrates that the overdrive current, Io, is zero until time 168, at which time the photocurrent, Iph, exceeds the threshold current, Itd. After time 168, the overdrive current, Io, increases to a value corresponding to the difference between the photocurrent Iph and the threshold current Itd. The relationship between the traces 164, 167, and 168 can also be expressed mathematically as follows: if Iph<Itd, then Iph+If−Itd=0 and if Iph>Itd, then Iph−Itd=Io.

Figure 6:
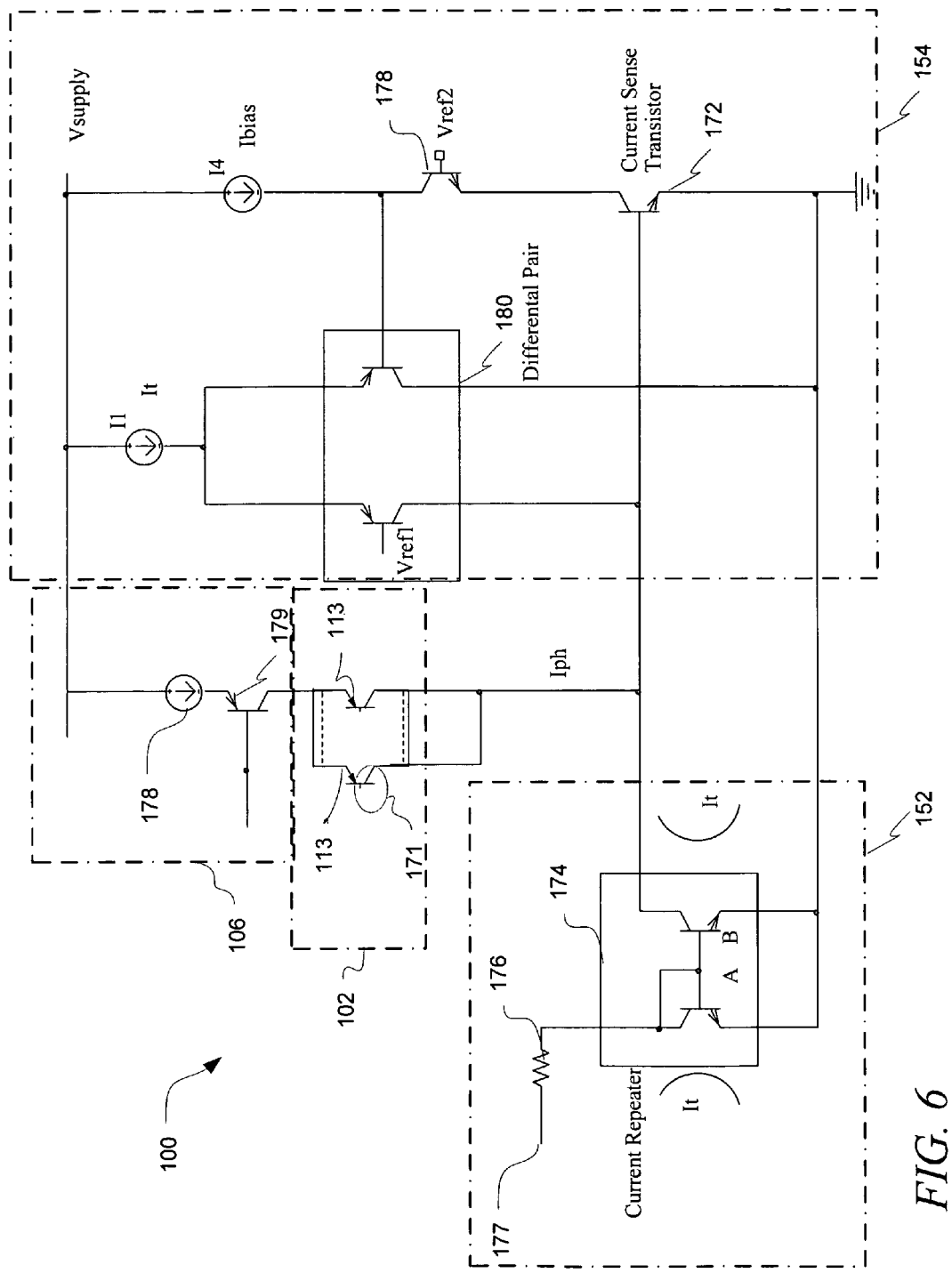
FIG. 6 is schematic circuit diagram illustrating one embodiment of a radiation detector 100 such as illustrated in FIG. 1.

FIG. 6 is a schematic circuit diagram illustrating one embodiment of the radiation detector 100 that illustrates one embodiment of the radiation sensor 102, the threshold selector 152, and the current sensor 154 portions of the detector module 104 in more detail. In this embodiment, the sensor module 102 comprises a bank of one or more radiation sense transistors 113 that are connected in parallel to generate the photocurrent, Iph, when exposed to suitable radiation, e.g., when the detector 100 receives prompt gamma rays such as generated by a nuclear event. In one embodiment, the supply voltage to the base-collector junction 171 of the radiation sense transistors 113 is sufficiently depleted to provide a suitably flat current response that is independent of radiation pulse width.

As shown in FIG. 6, test module 106 comprises a test switch transistor 179 that switches the sensor module 102 and detector module 104 from detecting radiation to operating in the test mode. During test mode (described above with reference to FIG. 1), the test module 106 provides a test signal via the test switch transistor 179. When not in a test mode, the voltage at the bases of the test switch transistor 179 and sense transistors 113 is the same so that the test switch transistor 179 can not forward bias the emitters of the sense transistors 113. In some safety critical applications, it is desirable that the test module 106 be configured to be resistant to accidental or malfunction-related test mode activation. Thus, in one embodiment, the test switch transistor 179 desirably prevents transmission of test signals from the test signal module 110 to the sensor 104 unless the enable signal 118 is applied to the test module 106. This helps to further prevent the detector module 104 from responding to a test signal when in detection mode.

The threshold selector 152 comprises a current repeater 174 and an external threshold select resistor 176 that is connected from the supply voltage to ground through the current repeater 174 to generate the threshold current, Itd. The external resistor 176 may be used to configure the threshold current level. A reference voltage 177 may be provided to the threshold definition resistor 176 to help eliminate threshold sensitivity to supply voltage and Vbe related temperature changes. The illustrated current sensor 154 comprises a current sense transistor 172. The radiation sense transistors 113 are connected to the base of the current sense transistor 17, which operates as a summing junction, e.g., the base of an N-P-N transistor having its emitter referenced to ground.

In one embodiment, the size of the current sense transistor 172 may result in miller's capacitance that reduces its frequency response. A grounded base transistor 178 is used to reduce the effect of this collector-base (Ccb) capacitance of the current sense transistor 172. The current sensor 154 may also include a degenerated differential pair 180 of P-N-P transistors that are used to steer an additional threshold current, It, to the input or ground providing a uni-polar feedback. The current feedback of the differential pair 180 operates as an amplifier with the input being the base of the current sense transistor 172. The base of the current sense transistor 172 thus acts as a virtual ground (low impedance) whose impedance is defined by loop gain and limited to the bandwidth of the sense transistor 172. In one embodiment, the virtual ground eliminates the need to charge the capacitance of the sensing transistors 113 during a radiation emitting event thereby enabling the current sense transistor 172 to respond substantially independent of the pulse width of incident radiation.

In one embodiment, the current sense transistor 172 sums the photocurrent from the radiation sense transistors 113, the feedback current from the differential pair 180, and threshold definition current from the current repeater 174. The feedback current matches the threshold definition current when no radiation is being received from the sense transistors 113. As a radiation is sensed by the radiation-sense transistors 113 and the photocurrent increases, the feedback current decreases until it reaches zero (the photocurrent equals the threshold definition current). When the feedback current reaches zero, the current sense transistor 172 turns on to zero volts at its collector. At that point, the voltage comparator 156 of FIG. 4 detects the voltage at the collector of the current sense transistor 172 reaching zero volts. In turn, the output switch 162 generates an output pulse, e.g., the 0.5 V output and a 1-2 µs pulse. In one embodiment, having a range of 10 v to 30 v supply voltage, there is only a 5% inaccuracy in the dose rate at which the voltage comparator 156 identifies that the photocurrent has exceeded the threshold current. Sources of this inaccuracy may include the external resistor 176 of FIG. 4, the photo current generations by the sense transistors 113, and the feedback current generation of the differential pair 180.

Figure 7:
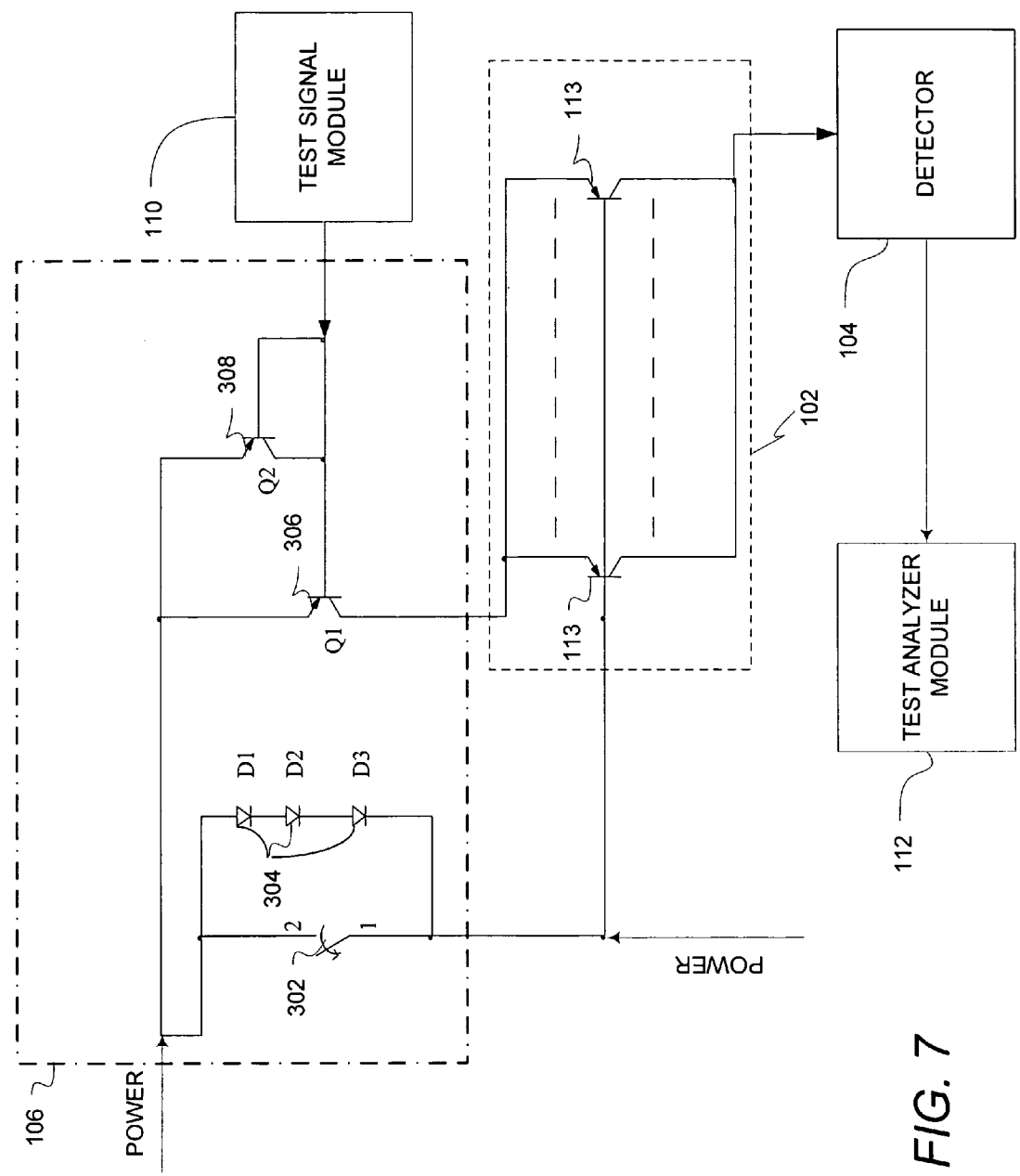
FIG. 7 is a schematic circuit diagram illustrating one embodiment of components of sense and test circuits in a radiation detector such as illustrated in FIG. 1.

FIG. 7 is a schematic circuit diagram illustrating one embodiment of certain components of sense and test circuits in the radiation detector 100. In the illustrated embodiment, the test module 106 comprises a switch 302, diodes 304, and transistors 306 and transistors 308. The switch 302 switches the bases of the sense transistors 113 to power for normal operation. When testing is enabled, the test module 106 biases the diodes 304 to provide a voltage drop that enables testing. For example, during test mode (described above with reference to FIG. 1), signals from the test signal module 110 are provided to the transistor 306 via the transistor 308. The transistor 306 provides the test signals to the emitters of the sense transistors 113. During test, the test enable module bias sense transistors 113 so that the transistors 113 pass the current through their collectors to simulate a photo current. When the test module 106 is not enabled, the transistors 113 are not properly biased and thus the module 106 does not provide any testing signals that may be provided from the transistor 306. This features desirably allows the transistors 113 to be easily switched from receiving power during detection operation and to prevent signals from the test signal module 110 from being provided by the sense transistors 113 to the detector module 104 except during testing operations.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others. The scope of the invention is indicated by the appended claims rather than by the foregoing description. All changes which come within the meaning and range of equivalency of the claims are to be embraced within their scope.

What is claimed is:

1. A device for detecting radiation, comprising:
a sensor comprising N sensor elements configured to sense and output a signal in response to radiation emanating from an unknown source;
a detector electrically connected to the sensor and configured to receive the response signal, wherein said detector is configured to detect the radiation based on a current level of the response signal; and
a test circuit electrically connected to the sensor, wherein the test circuit is configured to output an electrical signal comprising a current pulse; and
a reference circuit electrically connected to the test circuit,
wherein a first portion of the electrical signal flows from the test circuit through the sensor to the detector,
wherein a second portion the electrical signal flows from the test circuit to the reference circuit, wherein the test circuit is configured to test at least the sensor based on an output of the N sensor elements in response to the electrical signal and based on an output of the reference circuit in response to the electrical signal, and
wherein the output of the reference circuit is indicative of a fault when the output of the reference circuit is different from a level determined as function of the output of the N sensor elements.

2. The device of claim 1, wherein the sensor comprises at least one of Si, Ge, GaAs, SiGe, GaN, InGaAs, InSb, HgCdTe, $B_2Te_3$, A—Si, A—Se, $HgI_2$, $PbI_2$, C—SiGe, C (diamond), $YBa_2Cu_3O_{7-y}$, Bi—Sr—Ca—Cu—O compounds, and SiC.

3. The device of claim 1, wherein the test circuit comprises at least one of Si, Ge, GaAs, and SiGe.

4. The device of claim 1, wherein the detector is configured to detect gamma radiation based on the signal received from the sensor.

5. The device of claim 1, wherein the detector comprises at least one of Si, Ge, GaAs, and SiGe.

6. A device of claim 1, wherein the test circuit is further configured to test the detector.

7. The device of claim 1, wherein the function is 1/(N+1).

8. The device of claim 6, wherein the electrical signal comprises a current level less than a threshold and the response signal is indicative of the absence of radiation.

9. The device of claim 6, wherein the electrical signal comprises a current level greater than a threshold and the response signal is indicative of the presence of radiation.

10. The device of claim 9, wherein the test circuit is configured to test the threshold setting of the detector.

11. The device of claim 10, wherein the sensor, test circuit, and the detector are formed in a monolithic integrated circuit.

12. The device in claim 1, wherein the radiation comprises gamma radiation.

13. The device in claim 1, wherein the test circuit is configured to provide a signal that the detector responds to in less than about 50 ns.

14. The device of claim 6, wherein the sensor and the detector are substantially insensitive to the pulse width of the radiation.

15. The device of claim 1, wherein the sensor, the detector, and the test circuit are formed using the same process.

16. The device of claim 1, wherein the reference circuit comprises a transistor.

17. The device of claim 16, wherein each of the of sensor circuits comprises a transistor configured to sense the radiation and wherein each of the transistors is substantially to the transistor of the reference circuit identical.

18. The device of claim 1, wherein the test circuit is configured to identify that at least one of the of sensor circuits is defective.

19. The device of claim 1, wherein the sensor, test circuit, and the detector are formed in a monolithic integrated circuit.

20. The device of claim 18, wherein the sensor, test circuit, and the detector are formed in a monolithic integrated circuit.

21. The device in claim 19, wherein the radiation comprises gamma radiation.

22. A method of making a device for detecting radiation, the method comprising:
forming a sensor comprising N sensor elements configured to sense and configured to output a signal in response to radiation emanating from an unknown source;
electrically connecting a detector to the sensor, said detector is configured to detect the radiation based on a current level of the response signal;
electrically connecting a test circuit to the sensor, wherein the test circuit is configured to output an electrical signal comprising a current pulse; and
electrically connecting a reference circuit electrically to the test circuit,
wherein a first portion of the electrical signal flows from the test circuit through the sensor to the detector,
wherein a second portion the electrical signal flows from the test circuit to the reference circuit, wherein the test circuit is configured to test at least the sensor based on an output of the N sensor elements in response to the electrical signal and based on an output of the reference circuit in response to the electrical signal, and
wherein the output of the reference circuit is indicative of a fault when the output of the reference circuit is different from a level determined as function of the output of the N sensor elements.

23. The method of claim 22, wherein the sensor is formed to sense at least one of electromagnetic radiation, visible light, non-visible light, gamma rays, ionizing radiation, charged particles, ions, uncharged particles, and neutrons.

24. The method of claim 22, wherein at least one of forming the sensor, forming the detector, and forming the test circuit comprises a BiCom process.

25. The method of claim 22, wherein the test circuit is further connected to the detector to provide testing of the detector.

26. The method of claim 22, wherein forming at least the sensor and forming the detector comprises forming a first monolithic integrated circuit and wherein forming at least the test circuit comprises forming a second monolithic integrated circuit.

27. The method of claim 22, wherein forming the sensor, forming the detector, and forming the test circuit comprise forming a monolithic integrated circuit.

28. A device for detecting radiation, comprising:
means for sensing and outputting a signal in response to radiation emanating from an unknown source, wherein the sensing means comprises a plurality of N means for generating an electrical signal in response to sensing radiation;

means for detecting said signal received from the means for sensing radiation, wherein said detecting means comprises means for detecting the radiation based on a current level of the response signal;

means for testing at least the sensing means comprising means for outputting an electrical test signal to the means for sensing, said outputting means being configured to output an electrical test signal comprising a current pulse; and means for outputting a reference signal in response to the electrical test signal, wherein a first portion of the electrical test signal flows from the testing means through the sensing means to the detecting means, wherein a second portion the electrical test signal flows from the testing means to the reference signal outputting means, wherein the testing means is configured to test at least the sensing means based on an output of the N generating means in response to the electrical test signal and based on an output of the reference signal outputting means in response to the electrical test signal, and wherein the output of the reference signal outputting means is indicative of a fault when the output of the reference signal outputting means is different from a level determined as function of the output of the N generating means.

29. The device of claim 28, wherein the detecting means comprises a detector circuit.

30. The device of claim 28, wherein the detecting means is configured to identify that at least one of the plurality of generating means is defective.

31. The device of claim 28, further comprising means for testing to the detecting means.

32. The device of claim 28, wherein the sensing means comprises at least one sensing circuit.

33. The device of claim 28, wherein the detecting means is configured to detect gamma radiation based on the signal from the sensing means.

* * * * *